(12) United States Patent
O'Meara et al.

(10) Patent No.: US 7,470,591 B2
(45) Date of Patent: Dec. 30, 2008

(54) METHOD OF FORMING A GATE STACK CONTAINING A GATE DIELECTRIC LAYER HAVING REDUCED METAL CONTENT

(75) Inventors: David L. O'Meara, Poughkeepsie, NY (US); YoungJong Lee, Fishkill, NY (US); Cory Wajda, Sand Lake, NY (US)

(73) Assignee: Tokyo Electron Limited, Tokyo (JP)

( * ) Notice: Subject to any disclaimer, the term of this patent is extended or adjusted under 35 U.S.C. 154(b) by 288 days.

(21) Appl. No.: 11/239,321

(22) Filed: Sep. 30, 2005

(65) Prior Publication Data
US 2007/0077701 A1    Apr. 5, 2007

(51) Int. Cl.
*H01L 21/00*    (2006.01)

(52) U.S. Cl. .................. 438/287; 257/E21.19

(58) Field of Classification Search .................. 438/287, 438/722; 257/E21.19
See application file for complete search history.

(56) References Cited

U.S. PATENT DOCUMENTS

| 6,891,231 B2 | 5/2005 | Bojarczuk, Jr. et al. |
| 2004/0206724 A1 | 10/2004 | Nallan et al. |
| 2006/0060565 A9 * | 3/2006 | Nallan et al. .................. 216/67 |

* cited by examiner

*Primary Examiner*—Richard A. Booth
(74) *Attorney, Agent, or Firm*—Oblon, Spivak, McClelland, Maier & Neustadt, P.C.

(57) ABSTRACT

A method is provided for reducing the metal content and controlling the metal depth profile of a gate dielectric layer in a gate stack. The method includes providing a substrate in a process chamber, depositing a gate dielectric layer on the substrate, where the gate dielectric layer includes a metal element. The metal element is selectively etched from at least a portion of the gate dielectric layer to form an etched gate dielectric layer with reduced metal content, and a gate electrode layer is formed on the etched gate dielectric layer.

23 Claims, 5 Drawing Sheets

METHOD OF FORMING A GATE STACK CONTAINING A GATE DIELECTRIC LAYER HAVING REDUCED METAL CONTENT

CROSS-REFERENCE TO RELATED APPLICATIONS

The present application is related to U.S. patent application Ser. No. 11/711,721, titled "A METHOD FOR FORMING A THIN COMPLETE HIGH-PERMITTIVITY DIELECTRIC LAYER", filed on Sep. 30, 2004, assigned to the present assignee, the entire contents of which are hereby incorporated by reference.

FIELD OF THE INVENTION

The present invention relates to a method of forming a gate stack, and more particularly, to reducing the metal content and controlling the metal depth profile of a gate dielectric layer integrated into the gate stack.

BACKGROUND OF THE INVENTION

In the semiconductor industry, the minimum feature sizes of microelectronic devices are approaching the deep sub-micron regime to meet the demand for faster, lower power microprocessors and digital circuits. The downscaling of complimentary metal oxide semiconductor (CMOS) devices imposes scaling constraints on the gate dielectric material. The thickness of the standard $SiO_2$ gate dielectric layer is approaching a level (~10 angstrom (Å)) at which tunneling currents may significantly impact transistor performance and reliability. To increase device reliability and reduce electron leakage through the gate dielectric layer that electrically separates the gate electrode material from the active region (transistor channel) of the device, semiconductor transistor technology is using high dielectric constant (high-k) gate dielectric materials. Dielectric materials featuring a dielectric constant greater than that of $SiO_2$ (k~3.9) are commonly referred to as high-k materials. In addition, high-k materials may refer to dielectric materials that are deposited onto substrates (e.g., $HfO_2$, $ZrO_2$) rather than grown on the surface of the substrate (e.g., $SiO_2$, $SiO_xN_y$). High-k materials may incorporate metallic silicates or oxides (e.g., $Ta_2O_5$ (k~26), $TiO_2$ (k~80), $ZrO_2$ (k~25), $Al_2O_3$ (k~9), $HfSiO_x$ (k~10-15), $HfO_2$ (k~25)). High-K materials such as these allow increased physical thickness of the gate dielectric layer to decrease leakage current while maintaining a high capacitance for reducing electrical thickness, thereby increasing performance.

Threshold voltage ($V_t$) instability and mobility degradation are among the challenges for integration of high-k dielectric materials into gate stacks. In addition, the gate electrode material may chemically react with or diffuse into the underlying gate dielectric material. In one example, a polycrystalline silicon (poly-Si) gate electrode layer may react with a Hf-containing high-k material (e.g., $HfO_2$ or $HfSiO_x$) and form a detrimental silicide material. One proposed solution for these problems includes depositing an additional layer (e.g., a diffusion barrier) between the gate dielectric layer and the gate electrode layer. However, this adds a deposition step to the overall manufacturing process and creates new interfaces between the layers in the gate stack. The additional layer increases the physical thickness of the gate dielectric material which can reduce the overall dielectric constant of the gate stack and thereby affect the transistor performance.

SUMMARY OF THE INVENTION

A method is provided for forming a gate stack containing a gate dielectric layer.

In an embodiment of the invention, a method is provided for forming a gate stack by providing a substrate in a process chamber, depositing a gate dielectric layer on the substrate, where the gate dielectric layer comprises a metal element, selectively etching the metal element from at least a portion of the gate dielectric layer to form an etched gate dielectric layer with reduced metal content, and forming a gate electrode layer on the etched gate dielectric layer. In one example, the gate dielectric layer can be a metal oxide, a metal oxynitride, a metal silicate, or a nitrated metal silicate.

In another embodiment of the invention, a method is provided for forming a gate stack by providing a substrate in a process chamber, depositing a $HfSiO_x$ or $HfSiO_xN_y$ gate dielectric layer on the substrate, selectively etching the Hf element from at least a portion of the gate dielectric layer to form an etched gate dielectric layer with reduced Hf content, and forming a gate electrode layer on the etched gate dielectric layer. In one example, the etched gate dielectric layer can be a $SiO_x$ layer that is substantially depleted of Hf metal. In another example, the etched gate dielectric layer can include a non-etched portion and an etched portion that can be a $SiO_x$ layer that is substantially depleted of Hf metal.

In still another embodiment, a metal on semiconductor (MOS) device includes a substrate having dopant regions formed therein, and a gate stack formed on the substrate between said dopant regions. The gate stack includes a high-k film formed on the substrate and having a metal element therein, and a gate electrode formed on said high-k film. The high-k film includes a metal depleted region at an interface of the high-k film and the gate electrode, the metal depleted region having a substantially lower concentration of the metal element than a remaining portion of said high-k film.

DETAILED DESCRIPTION OF EMBODIMENTS OF THE INVENTION

In general, embodiments of the invention relate to a method of forming a gate stack, and more particularly, to reducing the metal content within a gate dielectric layer integrated into the gate stack. In one embodiment, the reduction of metal content is done by controlling the metal depth profile. Control over the metal content or metal depth profile can reduce chemical reactions between the gate electrode material and the underlying gate dielectric material, reduce diffusion of dopants, metals, and moisture from the gate electrode material, and allow adjusting of the work function of the gate stack to a desired value.

Figure 1:
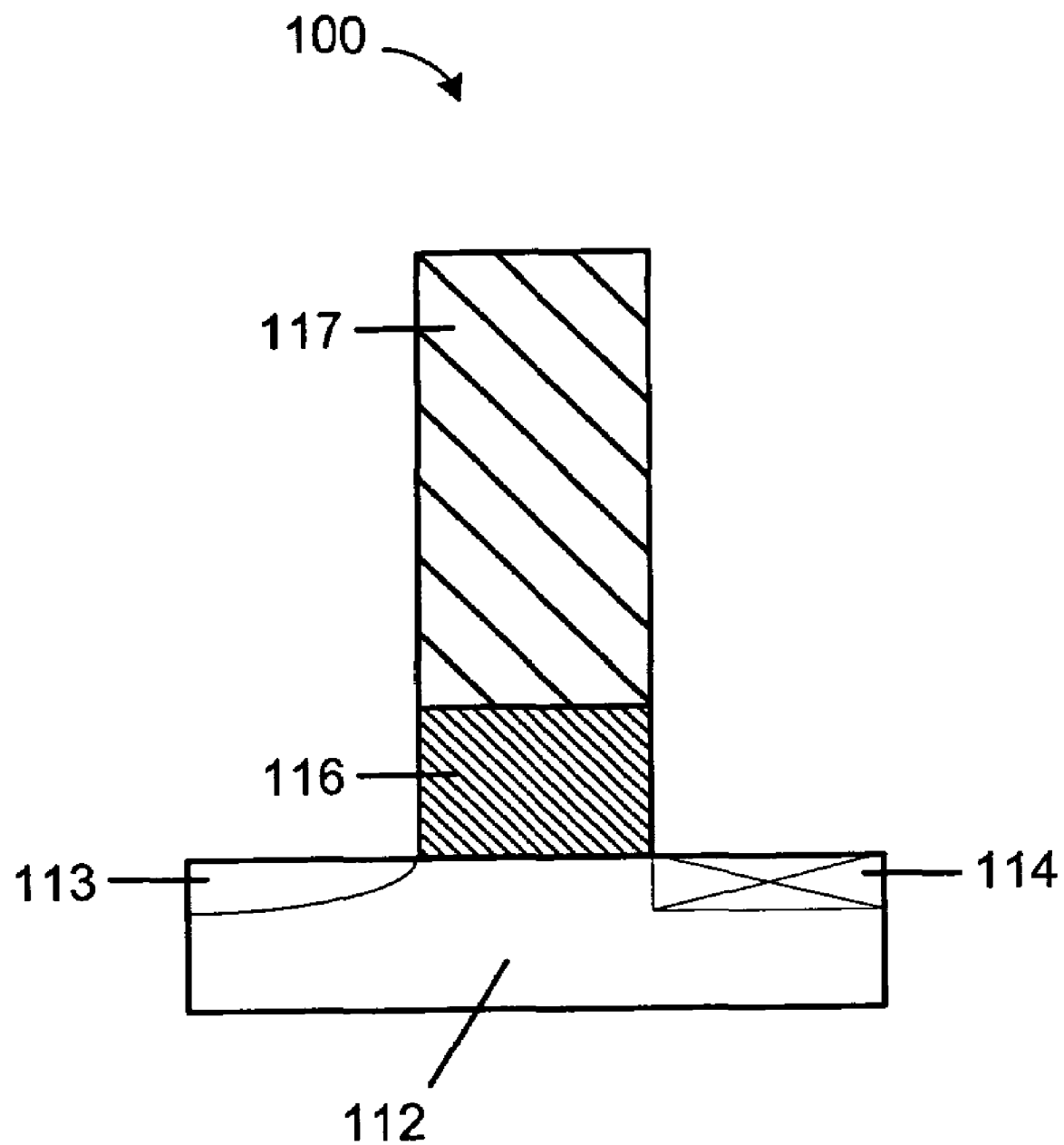
FIG. 1 schematically shows a cross-sectional view of a gate stack according to an embodiment of the invention.

Referring now to the drawings, FIG. 1 schematically shows a cross-sectional view of a gate stack according to an embodiment of the invention. The gate stack 100 contains a substrate 112 having doped regions 113 and 114 (e.g., a source region 113 and a drain region 114), a gate dielectric layer 116 formed on the substrate 115, and a gate electrode layer 117 formed on the gate dielectric layer 116. The substrate 112 can, for example, contain Si, Ge, Si/Ge, or GaAs. In addition the substrate 112 can contain a silicon-on-insulator (SOI) material. The insulator can, for example, be $SiO_2$. A Si substrate can be of n- or p-type, depending on the type of device being formed. The substrate (wafer) 112 can be of any size, for example a 200 mm substrate, a 300 mm substrate, or an even larger substrate.

According to one embodiment of the invention, the gate dielectric layer 116 can be a high-k layer containing a metal oxide, a metal oxynitride, a metal silicate, or a nitrated metal silicate, including $Ta_2O_5$, $TaSiO_x$, $TaSiO_xN_y$, $TiO_2$, $ZrO_2$, $Al_2O_3$, $Y_2O_3$, $HfO_2$, $HfSiO_x$, $HfSiO_xN_y$, $HfO_xN_y$, $HfAlO_x$, $HfTaO_x$, $HfTiO_x$, $ZrO_2$, ZrSiOx, $ZrSiO_xN_y$, $ZrO_xN_y$, $SrO_x$, $SrSiO_x$, $SrSiO_xN_y$, $LaO_x$, $LaSiO_x$, $LaSiO_xN_y$, $LaAlO_x$, $La_2Hf_2O_3$, $LaScO_3$, $DyScO_3$, $PrO_2$, $Pr_2O_3$, $CeO_2$, $NdO_2$, $YO_x$, $YSiO_x$, or $YSiO_xN_y$, or combination or mixture of two or more thereof. The thickness of the gate dielectric layer 116 can, for example, be between about 10 angstrom and about 200 angstrom. Alternately, the thickness of the gate dielectric layer 116 can be between about 20 angstrom and about 50 angstrom.

Although not shown in FIG. 1, the gate stack 100 may further contain a thin dielectric interface layer at the interface of the gate dielectric layer 116 and the substrate 112. The interface layer can, for example, be an oxide layer (e.g., $SiO_2$), a nitride layer (e.g., $SiN_x$), or an oxynitride layer (e.g., $SiO_xN_y$), or a combination of two or more of these. Integrated circuits containing a Si substrate commonly employ $SiO_2$ and/or $SiO_xN_y$ dielectric interface layers that can have excellent electrical properties, including high electron mobility and low electron trap densities. Gate stacks containing a high-k layer formed on $SiO_2$ and/or $SiO_xN_y$ dielectric interface layers can allow the interface dielectric layer to have a thickness of only about 5-10 angstrom.

The deposition of a gate dielectric layer on a Si substrate, or subsequent annealing of the as-deposited gate dielectric layer, can result in oxidation of the Si substrate and formation of a thin dielectric oxide interface layer at the interface of the Si substrate and the dielectric layer. The oxidation of the Si substrate is thought to proceed by out-diffusion of oxygen from the dielectric layer, thereby increasing the relative metal content of the gate dielectric layer. According to one embodiment of the invention, a metal element from the metal-rich gate dielectric layer can be selectively etched to reduce the metal content of the layer. In one example, the metal content of the metal-rich gate dielectric layer can be reduced back to the as-deposited gate dielectric layer.

In FIG. 1, the gate electrode layer 117 can, for example, be about 1000 angstrom thick. The gate electrode layer 117 can contain silicon (e.g., doped poly-Si or SiGe), or a metal or metal-containing material, including W, WN, Al, Ta, TaN, TaSiN, Mo, MoN, Zr, V, HfN, HfSiN, Ti, TiN, TiSiN, Re, Ru, Co, Pd, Ni, Ir, Pt, $In_2O_3$, $Os_2O_3$, $RuO_2$, $IrO_2$, ZnO, $MoO_2$, and $ReO_2$.

In one embodiment of the invention, a gate stack, having the exemplary structure depicted in FIG. 1, is formed with a gate dielectric layer 116 having a reduced metal content compared to an as-deposited gate dielectric layer. A controlled metal depth profile may also be implemented within the gate dielectric layer. The ability to control the metal content of the gate dielectric layer can be utilized to reduce or eliminate threshold voltage ($V_t$) instability and mobility degradation within the gate stack. In addition, reducing the metal content or controlling the metal depth profile within the gate dielectric material can reduce chemical reactions between the gate electrode layer and the gate dielectric layer and reduce or eliminate dopant diffusion during deposition of the gate electrode layer on the gate dielectric layer, during subsequent processing (e.g., annealing) of the gate stack, or during the lifetime of a device containing the gate stack. For example, the present invention may reduce a chemical reaction between a poly-Si gate electrode layer and a Hf-containing gate dielectric layer (e.g., $HfO_2$, $HfSiO_x$, or $HfSiO_xN_y$) that causes detrimental interfacial compounds such as hafnium silicides, and may reduce the diffusion of boron from the doped poly-Si layer to the Hf-containing gate dielectric layer.

Furthermore, reducing the metal content and controlling the metal depth profile of the gate dielectric material can be utilized to modify the dielectric constant of an as-deposited dielectric layer. In one example, the as-deposited gate dielectric layer can be a $HfSiO_x$ layer with a dielectric constant between about 10 and about 15, depending in part on the relative amount of silicon in the layer. According to an embodiment of the invention, the Hf metal content can be reduced from that of the as-deposited $HfSiO_x$ layer to that of a substantially Hf-depleted $SiO_x$ layer having a dielectric constant approaching that of $SiO_2$ (i.e. 3.9), or any composition in between.

Figure 2:
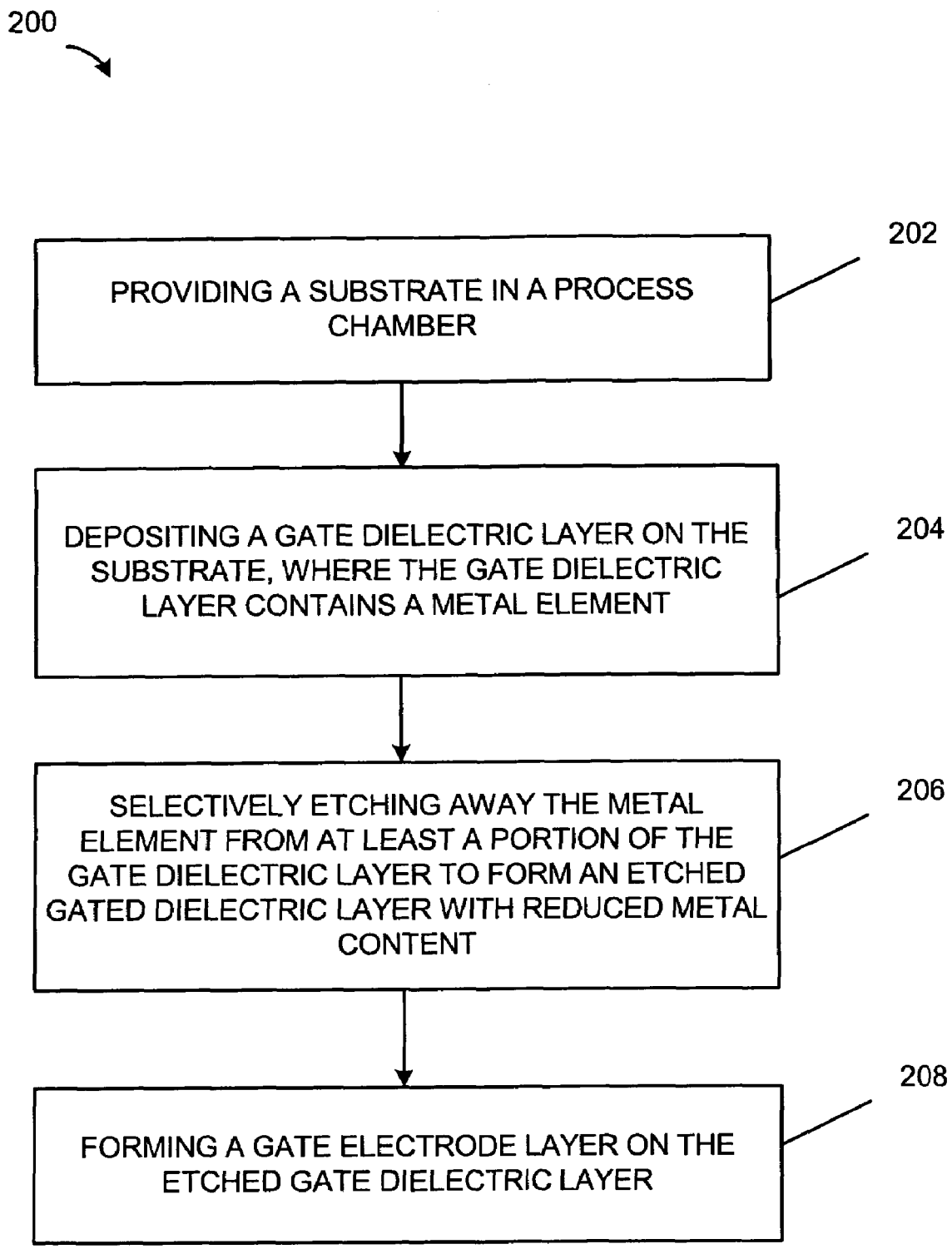
FIG. 2 is a process flow diagram for forming a gate stack according to an embodiment of the invention.

Reference will now be made to FIG. 2 and FIG. 3. FIG. 2 is a process flow diagram for forming a gate stack according to an embodiment of the invention. FIGS. 3A-3D schematically show formation of gate stacks according to embodiments of the invention. In step 202, a substrate 302 (shown in FIG. 3A) is provided in a process chamber of a processing system. The processing system can, for example, be the batch processing system depicted in FIG. 5 or, alternately, a single wafer processing system. The substrate 302 may be cleaned to remove contaminants and/or a native oxide layer from the substrate. In addition, a thin dielectric interface layer, as described above, may be formed on the cleaned substrate 302 prior the deposition step 204.

Figure 3A:
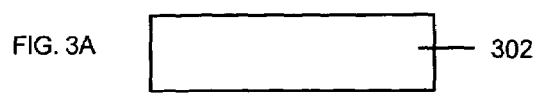
FIGS. 3A-3F schematically show formation of gate stacks according to embodiments of the invention.
Figure 3B:
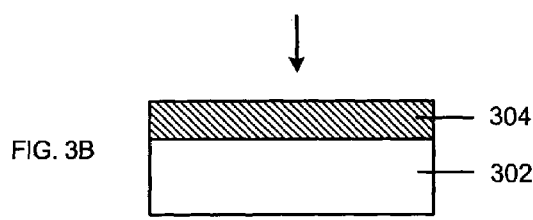

In step 204, a gate dielectric layer 304 is deposited on the substrate 302 as shown in FIG. 3B. The gate dielectric layer 304 can be selected from various metal oxides, metal silicates, or derivatives thereof. The gate dielectric layer 304 can, for example, be deposited by various deposition processes, including, but not limited to, thermal (non-plasma) chemical vapor deposition (TCVD), plasma-enhanced chemical vapor deposition (PECVD), atomic layer deposition (ALD), and physical vapor deposition (PVD).

In a TCVD process, for example, the substrate 302 is exposed to process gas containing a metal-containing precursor for a time period that results in the desired deposition of the gate dielectric layer 304. Process conditions that enable the deposition of the gate dielectric layer may be determined by direct experimentation and/or design of experiments. For example, adjustable process parameters can include deposition time, temperature (e.g., substrate temperature), process chamber pressure, process gases and relative gas flows of the process gases, among other parameters. The process parameter space for the deposition process can, for example, utilize a process chamber pressure less than about 10 Torr, a process gas flow rate less than 2000 sccm, a precursor gas flow rate less than 1000 sccm, and a substrate temperature between about 20° C. and about 600° C.

In one example, when a metal oxide high-k dielectric layer is deposited using TCVD, a process gas comprising a metal-containing precursor is introduced into a processing chamber containing a heated substrate to be processed. The substrate is exposed to the process gas for a time period that results in the desired deposition of the metal oxide high-k layer. Metal oxide high-k materials can be deposited from metal organic chemical vapor deposition (MOCVD) precursors. In the exemplary case of Hf and Zr (M=Hf, Zr), the MOCVD precursors can comprise metal alkoxides (e.g., $M(OR)_n$) and metal alkylamides (e.g., $M(NR)_4$) that can deposit metal oxide layers at substrate temperatures above about 300° C. The metal alkoxide precursors can, for example, be selected from four-coordinate complexes such as $M(OMe)_4$, $M(OEt)_4$, $M(OPr)_4$, and $M(OBu^t)_4$, where Me is methyl, Et is ethyl, Pr is propyl, and $Bu^t$ is tert-butyl. The metal alkylamide precursor can, for example, be selected from $M(NMe_2)_4$, $M(NEt_2)_4$, and $M(NPr_2)_4$. The MOCVD precursor can also be selected from six-coordinate complexes such as $M(OBu^t)_2(MMP)_2$ and $M(MMP)_4$, where MMP= $OCMe_2CH_2OMe$. As would be appreciated by those skilled in the art, other metal-containing precursors may be employed without departing from the scope of the invention.

$Hf(OBu^t)_4$ is a hafnium-containing MOCVD precursor that enables deposition of $HfO_2$, $HfSiO_x$, and $HfSiO_xN_y$ high-k layers. $Hf(OBu^t)_4$ comprises a relatively high vapor pressure ($P_{vap}$~1 Torr at 65° C.), and therefore requires minimal heating of the precursor and precursor delivery lines for delivering the precursor to the process chamber. In addition, $Hf(OBu^t)_4$ does not decompose at temperatures below about 200° C., which significantly reduces precursor decomposition due to interactions with chamber walls and gas phase reactions. The $Hf(OBu^t)_4$ precursor can, for example, be delivered to the process chamber using a liquid injection system comprising a vaporizer that is maintained at a temperature of 50° C., or higher. An inert carrier gas (e.g., He, $N_2$) can be mixed with the vaporized precursor to aid in the delivery of the precursor to the process chamber.

$Hf(OBu^t)_4$ contains both the Hf metal and the oxygen required to grow stoichiometric $HfO_2$ layers under proper process conditions, thereby providing reduced process complexity. However, the process gas containing the MOCVD precursor can further contain a second oxygen-containing gas as a second source of oxygen in order to facilitate growth of a stoichiometric layer.

Similarly, metal silicate high-k materials can be deposited from MOCVD precursors and a silicon-containing gas. For example, a $HfSiO_x$ high-k layer can be deposited on a substrate using $Hf(OBu^t)_4$ precursor and a silicon-containing gas. The silicon-containing gas can, for example, contain silane ($SiH_4$), disilane ($Si_2H_6$), dichlorosilane ($SiH_2Cl_2$), hexachlorodisilane ($Si_2Cl_6$), bis(tertbutylamino)silane ($SiH_2(NBu^t)_2$), or tetrakis(dimethylamino) silane ($Si(NMe_2)_4$), tetraethylorthosilicate (TEOS, $Si(OEt)_4$)), or a combination of two or more thereof. Metal silicate high-k materials may further contain nitrogen, for example $HfSiO_xN_y$, where the nitrogen may be incorporated by adding a nitrogen-containing gas such as $NH_3$ to the process gas or by "stuffing" nitrogen into a deposited $HfSiO_x$ film by ion implantation.

The process gas used for metal oxide or metal silicate growth can further comprise a carrier gas (e.g., an inert gas) and an oxidizing gas. The inert gas can include at least one of Ar, He, Ne, Kr, Xe, and $N_2$. The addition of inert gas can, for example, dilute the process gas or adjust the process gas partial pressure(s). The oxidizing gas can, for example, contain an oxygen-containing gas comprising at least one of $O_2$, $O_3$, $H_2O$, $H_2O_2$, NO, $NO_2$, and $N_2O$. The role of the oxygen-containing gas in the deposition process can be to fill any oxygen vacancies in the metal oxide or metal silicate high-k layer, or to chemically modify the metal oxide precursor. The modification can involve interaction of the oxygen-containing gas with the metal oxide precursor in the gas phase or on the deposition surface.

Still referring to FIGS. 2 and 3, in step 206, the gate dielectric layer 304 is exposed to an etching gas to selectively etch a metal element from at least a portion of the gate dielectric layer 304. In general, the etching gas can include any gas capable of selectively etching a metal element from the gate dielectric layer 304. The etching gas can be a thermal etching gas, a non-plasma excited etching gas or a plasma excited etching gas. According to one embodiment of the invention, the selective etching as described herein, includes faster removal (etching) of a metal element (e.g., Hf) than that of a non-metal element (e.g., Si) from the dielectric layer 304. According to another embodiment of the invention, the selective etching includes faster removal of one metal element than that of another metal element from the gate dielectric layer 304.

It is believed that the selective etching process is due to preferential formation of volatile metal-containing reaction products during the etching step 206. In one example, exposing a $HfSi_xO_y$ gate dielectric layer with an HCl etching gas may form volatile hafnium chloride or hafnium oxychloride reaction products while the silicon in the $HfSi_xO_y$ gate dielectric layer is not significantly etched or is etched at a slower rate than the hafnium metal element.

According to an embodiment of the invention, the etching gas can contain a HX gas, including HF, HCl, HBr, HI, or mixtures thereof. According to another embodiment of the invention, the etching gas can contain $X_2$ gas, including $F_2$, $Cl_2$, $Br_2$, or $I_2$, or a combination thereof. According to another embodiment of the invention, the etching gas can contain $C_xX_z$ gas, $C_xH_yX_z$ gas, or radicals or ions derived therefrom. Examples of $C_xX_z$ gases include $C_5F_8$, $C_4F_6$, $C_4F_8$, and $CF_4$, and examples of $C_xH_yX_z$ gases include $CHF_3$, $CH_2F_2$, $CHCl_3$, and $CH_2Cl_2$. The etching gas may contain a noble gas such as Ar, but this is not required for embodiments of the invention.

Any of the above etching gases may be introduced in a plasma or non-plasma environment. Moreover, the etching process may be preceded by a plasma ion bombardment step using an inert gas in order to disrupt the high-k layer for subsequent etching. These techniques are described in U.S. patent application Ser. No. 11/711,721, which is incorporated herein by reference.

Further, adjustable process parameters in the etching step 206 can include deposition time, temperature (e.g., substrate temperature), process chamber pressure, etching gases and relative gas flows of the etching gases, among other parameters. The process parameter space for the etching step 206 process can, for example, utilize a process chamber pressure less than about 1000 Torr, an etching gas flow rate less than 2000 sccm, and a substrate temperature between about 20° C. and about 1000° C.

Figure 3C:
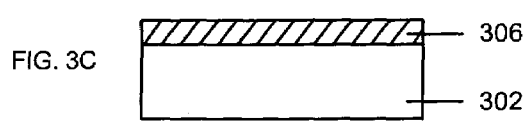

FIG. 3C depicts an etched gate dielectric layer 306. According to one embodiment of the invention, the etched gate dielectric layer 306 can have a substantially uniform metal content throughout the entire thickness of the layer 306, where the metal content is lower than in the un-etched gate dielectric layer 304. In one example, the as-deposited dielectric layer 304 can be a metal silicate layer or a nitrated metal silicate layer, for example $TaSiO_x$, $TaSiO_xN_y$, $HfSiO_x$, $HfSiO_xN_y$, $ZrSiO_x$, $ZrSiO_xN_y$, $SrSiO_x$, $SrSiO_xN_y$, $LaSiO_xN_y$, or $YSiO_xN_y$. In the case of $HfSiO_x$ or $HfSiO_xN_y$, the etched gate dielectric layer 306 can have substantially uniform Hf content throughout the entire thickness of the layer 306. According to another embodiment of the invention, the etched gate dielectric layer 306 can have a graded metal depth profile where the metal content is higher at the bottom of the layer 306 than at the top of the layer 306. In one example, the as-deposited dielectric layer 304 can be HfSiO$_x$ or HfSiO$_x$N$_y$, and the etched gate dielectric layer 306 can have a graded Hf depth profile where the layer 306 substantially comprises SiO$_x$ (where x is less than or equal to 2) at the top of the layer 306 and HfSiO$_x$ or HfSiO$_x$N$_y$ at the bottom of the layer 306.

The graded metal depth profile can be an abrupt change in metal concentration from the etched to non-etched regions, forming a step like profile. Alternatively, a gradual change in metal concentration from the etched to non-etched region may be achieved. For example, in the case of HCl, the metal concentration profile would be determined by the diffusivity of the HCl and the Hf—Cl volatile species through the SiO$_2$/HfSiO$_2$ layer. With the partial pressure of the HCl sufficiently low, the profile would be self-limiting in depth and an abrupt transition can be achieved. If the metal removal process is not taken to completion, a gradient profile would result.

In another example, the as-deposited dielectric layer 304 can contain a metal oxide layer (e.g., Ta$_2$O$_5$, TiO$_2$, ZrO$_2$, Al$_2$O$_3$, Y$_2$O$_3$, HfO$_2$, ZrO$_2$, SrO$_x$, or LaO$_x$, YO$_x$) and the etching step 206 can reduce the metal content of the as-deposited dielectric layer 304 by creating metal vacancies in the etched gate dielectric layer 306.

According to an embodiment of the invention, the etched dielectric layer can have lower surface roughness than the as-deposited dielectric layer. It is contemplated that since the as-deposited dielectric layer is often observed to have high metal content at the layer surface, exposing the dielectric layer to an etching gas to selectively etch the metal element, can result in an etched dielectric layer with a smoother surface than the as-deposited dielectric layer. A smooth surface dielectric can provide improved dielectric integrity, which corresponds to the thinnest continuous dielectric layer feasible. Specifically, if the surface of the dielectric is smooth, more of the dielectric film is available across an area to resist dielectric leakage, thereby improving the dielectric properties of a dielectric film. Similarly, the smooth dielectric provides a more conformal dielectric film having improved dielectric properties. Still further, transistors with smooth dielectric layers theoretically have better mobility, because the electric field imposed on the channel is more uniform than if the dielectric layer were rough. A uniform electric field promotes better mobility by reducing scattering along the substrate/dielectric interface.

Figure 3E:

FIG. 3E depicts an etched gate dielectric layer 310 containing an etched portion 304$a$ and an non-etched portion 304$b$, where the metal content is lower in the etched portion 304$a$ than in the non-etched portion 304$b$, and the metal content of the non-etched portion 304$b$ is not substantially changed by the etching step 206. In one example, the as-deposited dielectric layer 304 can be HfSiO$_x$ or HfSiO$_x$N$_y$, the etched gate dielectric layer 310 can substantially comprise a SiO$_x$ portion 304$a$ and a non-etched portion 304$b$. In a preferred embodiment, the etched SiO$_x$ portion is from 3-20 angstrom thick. In another embodiment, the etched SiO$_x$ portion is from 3-10 angstrom thick. While it may be possible to deposit dielectric layers of about 20 angstrom, unlike the metal depleted layer of the present invention, such deposited layers add to the overall thickness of the gate stack, for example. Moreover, deposited oxide layers are not expected to provide the continuous and smooth coverage that can be provided by embodiments of the etched layer of the present invention. Still further, any surface roughness in the as-deposited dielectric layer (caused by metal content, for example) may disrupt the deposition of an oxide layer on the dielectric layer thereby affecting the electrical properties of the deposited oxide layer. However, creating a metal depleted layer in accordance with the present invention can provide a SiO$_x$ layer with conformal and complete coverage of the as-deposited dielectric layer, resulting in improved electrical properties.

The SiO$_x$ portion 304$a$ is expected to act as a good diffusion barrier between the gate electrode material and the non-etched portion 304$b$. In still another embodiment, the etched layer 310 is not depleted of metal to the extent that this layer substantially comprises SiO$_x$. Process parameters of the etch process may be altered to vary the characteristics of the etched layer 310. While the embodiment of FIG. 3E shows an abrupt transition from the etched to non-etched portion, a gradual transition can be achieved as discussed above. Further, the etched portion 304$a$ can have any of the characteristics of the etched layer 306 described above.

Figure 3D:
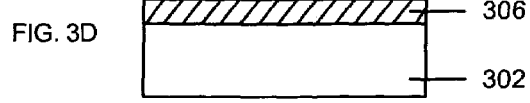
Figure 3F:
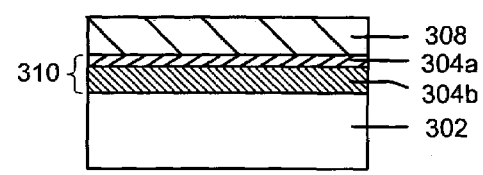

In step 208, a gate electrode layer 306 is formed on the etched gate dielectric layer 308 as shown in FIGS. 3D and 3F. As described above in reference to FIG. 1, the gate electrode layer 308 can contain silicon (e.g., doped poly-Si or SiGe), a metal, or metal-containing materials, including W, WN, Al, Ta, TaN, TaSiN, Mo, MoN, Zr, V, HfN, HfSiN, Ti, TiN, TiSiN, Re, Ru, Co, Pd, Ni, Ir, Pt, In$_2$O$_3$, Os$_2$O$_3$, RuO$_2$, IrO$_2$, ZnO, MoO$_2$, and ReO$_2$.

In one example, the effects of exposing a dielectric layer to an etching gas was examined using a quartz substrate containing a thick HfSiO$_x$N$_y$ dielectric layer (Hf~35 atomic percent, Si~8 atomic percent, O~40 atomic percent, N~17 atomic percent). The HfSiO$_x$N$_y$ dielectric layer was exposed to HCl gas for 40 min at a process chamber pressure of 400 Torr and a substrate temperature of 850° C. Chemical analysis of the etched dielectric layer showed that the exposure to the HCl gas reduced the thickness of the dielectric layer from about 150 nm to about 85 nm. In addition, the Hf content of the dielectric layer was reduced from about 35 atomic percent to less than about 0.5 atomic percent. The selectively etched dielectric layer mainly contained SiO$_x$, with a similar composition as the quartz (SiO$_2$) substrate.

One requirement for successfully integrating a dielectric material into a gate stack is that the dielectric material form a complete layer on the substrate and that the complete layer have good thickness uniformity. A complete dielectric layer with good thickness uniformity is required to increase device reliability and reduce electron leakage from a gate electrode layer through the dielectric material to the substrate.

In general, different modes of film growth can be encountered when depositing a thin film or layer on a substrate. A Frank-Van Der Merwe thin film growth is characterized by an ideal epitaxial layer by layer growth on a substrate, whereas a Volmer-Weber thin film growth is characterized by island growth on a substrate. A Stranski-Krastanov thin film growth is characterized by island growth coupled with a layer by layer growth on a substrate. With dielectric materials, the Volmer-Weber and/or Stranski-Krastanov growth mode(s) is/are frequently observed.

Figure 4A:
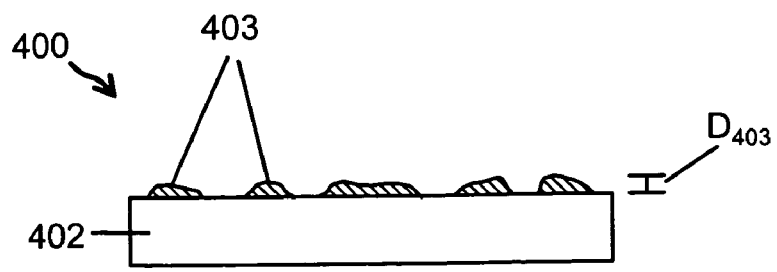
FIGS. 4A-4D schematically show formation of a gate stack according to an embodiment of the invention.

According to an embodiment of the invention, a thin complete dielectric layer with controlled metal content can be formed with minimum of gaps or variations in the thickness of the layer. FIG. 4A shows islands of dielectric material 403 formed on a substrate 402. The figure illustrates Volmer-Weber growth when depositing a dielectric material on a substrate 403. Instead of forming a thin complete dielectric layer with no gaps and good thickness uniformity (Frank-Van der Merwe growth mode), the deposition process forms islands of the deposited dielectric material 403 with gaps that expose the substrate 402 between the islands of the dielectric material 403. The islands have a thickness $D_{403}$ that can, for example, be between about 5 Å and about 50 Å, or greater. The thickness $D_{403}$ and the lateral size of the islands can vary depending on the type of the dielectric material 403 and the type and surface preparation (e.g., formation of a dielectric interface layer) of the substrate 402. Furthermore, the thickness $D_{403}$ and the lateral size of the islands can depend on the deposition and annealing conditions of the dielectric material 403.

Figure 4B:
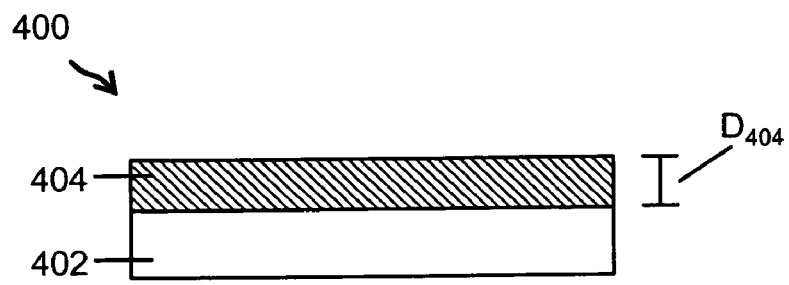

Further deposition of the dielectric material 403 onto the substrate 402 in FIG. 4A, results in a thick complete dielectric layer 404 on the substrate 402, as shown in FIG. 4B. A complete dielectric layer is referred to herein as a dielectric layer that completely covers, e.g., is continuous over, the underlying substrate 402 without any gaps. The thick complete dielectric layer 404 can, for example, have a thickness $D_{404}$ between about 30 Å and about 200 Å with good thickness uniformity. The minimum thickness to which the dielectric layer must be deposited before a complete layer is achieved may vary among dielectric materials, but generally is greater than 50 Å. However, the thickness $D_{404}$ can be too great for many semiconductor devices that can, for example, require a thickness $D_{404}$ that is between about 10 Å and about 40 Å. A thin complete dielectric layer with a thickness less than $D_{404}$ cannot simply be deposited onto the substrate 402. Thus, by the method described in an embodiment of the invention, the complete dielectric layer of thickness $D_{404}$ is first formed, then exposed to an etching gas to selectively etch a metal element in the layer 404 and to achieve the desired thickness less than $D_{404}$.

Figure 4C:
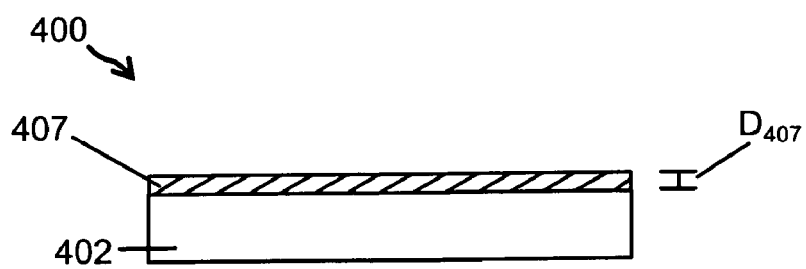

FIG. 4C shows formation of a thin complete dielectric layer 407 according to an embodiment of the invention. The thin complete dielectric layer 407 is formed by first depositing the thick complete dielectric layer 406 shown in FIG. 4B, and then exposing the layer 404 to an etchant gas to form a thin complete dielectric layer 407 with a thickness $D_{407}$ that has reduced metal content or is depleted of metal (e.g., $SiO_x$), where the thickness $D_{407}$ is less than $D_{404}$. According to one embodiment of the invention, the thickness $D_{404}$ can be between about 30 Å and about 200 Å. Alternately, the thickness $D_{404}$ can be between about 50 Å and about 100 Å. According to one embodiment of the invention, the thickness $D_{407}$ can be between about 5 Å and about 50 Å. Alternately, the thickness $D_{407}$ can be between about 30 Å and about 40 Å.

Figure 4D:
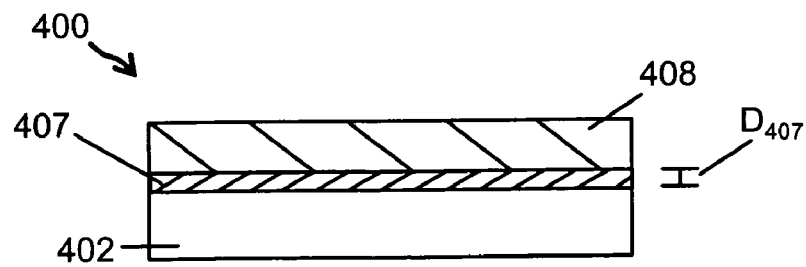

FIG. 4D shows a gate electrode layer 408 formed on the etched gate dielectric layer 407.

In one example, FIGS. 4A-4D show a method for forming an ultra thin complete $SiO_x$ gate dielectric layer by depositing a thick metal silicate or nitrated metal silicate layer on a substrate and selectively etching substantially all the metal element from the as-deposited dielectric layer. The method of depositing/selectively etching provides an ultra thin complete $SiO_x$ dielectric layer that simply cannot practically be directly deposited onto a substrate by other methods.

Figure 5:
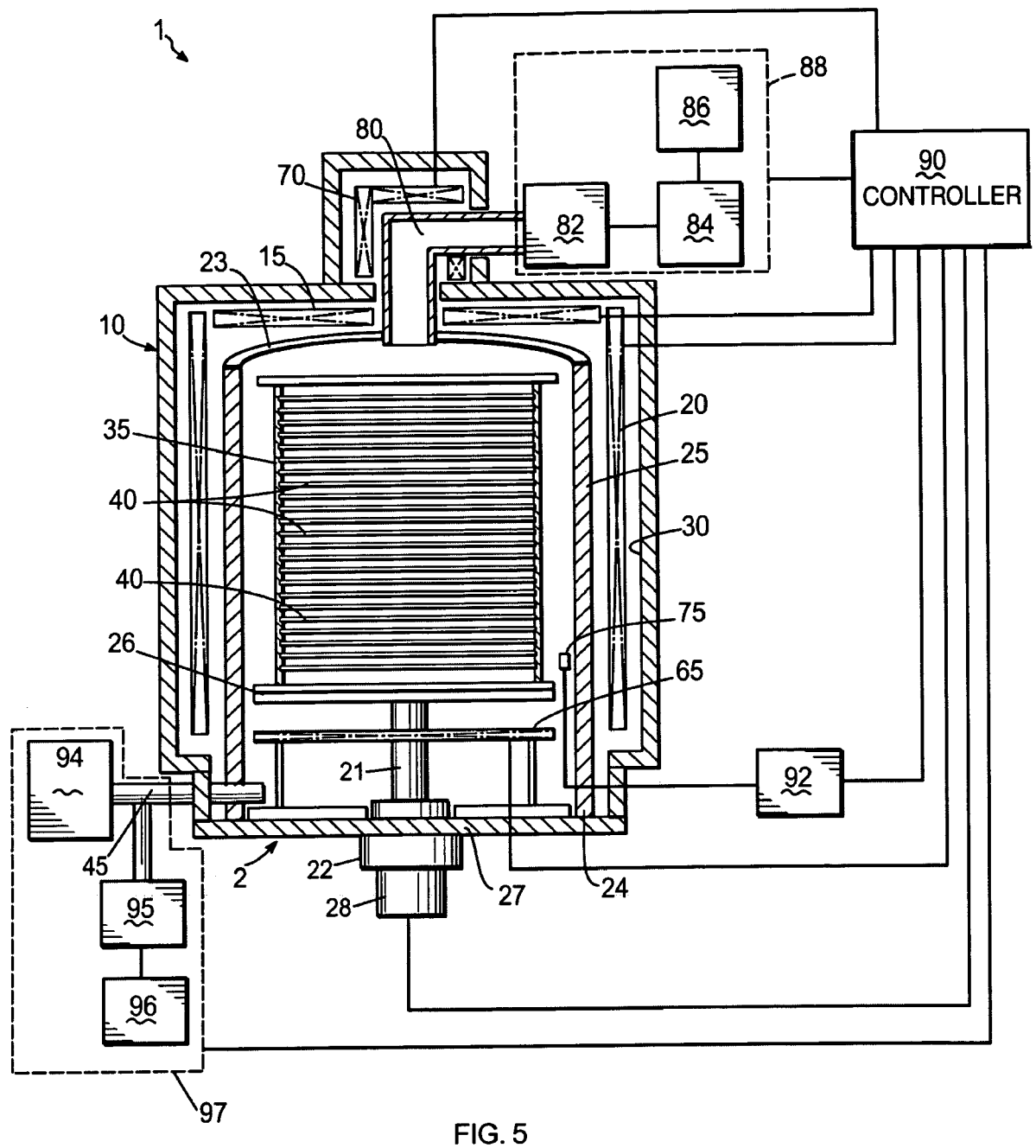
FIG. 5 shows a simplified block diagram of a batch processing system for processing a substrate according to an embodiment of the invention.

FIG. 5 shows a simplified block diagram of a batch processing system for processing a substrate according to an embodiment of the invention. The batch processing system 1 contains a process chamber 10 and a process tube 25 that has an upper end 23 connected to an exhaust pipe 80, and a lower end 24 hermetically joined to a lid 27 of cylindrical manifold 2. The exhaust pipe 80 discharges gases from the process tube 25 to a vacuum pumping system 88 to maintain a pre-determined atmospheric, or below atmospheric, pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the process tube 25. When the lid 27 is positioned at its uppermost position, the lid 27 is adapted to close the open end of the manifold 2.

A gas delivery system 97 is configured to introduce gases into the process chamber 10. A plurality of gas supply lines can be arranged around the manifold 2 to supply a plurality of gases into the process tube 25 through the gas supply lines. In FIG. 1, only one gas supply line 45 among the plurality of gas supply lines is shown. The gas supply line 45 shown, is connected to a first gas source 94. In general, the first gas source 94 can supply gases for processing the substrates 40, including gases for depositing dielectric layers onto the substrates 40, or an etching gas for dry etching the substrates 40.

In addition, or in the alternate, one or more of the gases can be supplied from the (remote) plasma source 95 that is operatively coupled to a second gas source 96 and to the process chamber 10 by the gas supply line 45. The plasma-excited gas is introduced into the process tube 25 by the gas supply line 45. The plasma source 95 can, for example, be a microwave plasma source, a radio frequency (RF) plasma source, or a plasma source powered by light radiation. In the case of a microwave plasma source, the microwave power can be between about 500 Watts (W) and about 5,000 W. The microwave frequency can, for example, be 2.45 GHz or 8.3 GHz. In one example, the remote plasma source can be a Downstream Plasma Source Type AX7610, manufactured by MKS Instruments, Wilmington, Mass., USA.

A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) can be formed in the wall of the process chamber 10 as a cooling medium passage. The heaters 20, 65, and 15 can, for example, maintain the temperature of the substrates 40 between about 20° C. and about 900° C.

The vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas supply line 45 of the gas delivery system 97 and the process pressure can be adjusted by the APC 82. The trap 84 can collect unreacted precursor material and by-products from the process chamber 10.

The process monitoring system 92 comprises a sensor 75 capable of real-time process monitoring and can, for example, include a mass spectrometer (MS), a FTIR spectrometer, or a particle counter. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas delivery system 97, motor 28, process monitoring system 92, heaters 20, 15, 65, and 70, and vacuum pumping system 88. The controller 90 may be implemented as a DELL PRECISION WORKSTATION 610™. The controller 90 may also be implemented as a general purpose computer, processor, digital signal processor, etc., which causes a substrate processing apparatus to perform a portion or all of the processing steps of the invention in response to the controller 90 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 90 may be locally located relative to the processing system 1, or it may be remotely located relative to the processing system 1 via an internet or intranet. Thus, the controller 90 can exchange data with the processing system 1 using at least one of a direct connection, an intranet, and the internet. The controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, and the internet.

It is to be understood that the batch processing system 1 depicted in FIG. 5 is shown for exemplary purposes only, as many variations of the specific hardware can be used to practice the present invention, and these variations will be readily apparent to one having ordinary skill in the art. The processing system 1 in FIG. 5 can, for example, process substrates of any size, such as 200 mm substrates, 300 mm substrates, or even larger substrates. Furthermore, the processing system 1 can simultaneously process up to about 200 substrates, or more. Alternately, the processing system 1 can simultaneously process up to about 25 substrates.

Alternately, a single wafer deposition system may be used to deposit and etch the gate dielectric layer according to an embodiment of the invention. One example of a single wafer deposition system is described in U.S. patent application Ser. No. 11/711,721, titled "A METHOD FOR FORMING A THIN COMPLETE HIGH-PERMITTIVITY DIELECTRIC LAYER", filed on Sep. 30, 2004, the entire contents of which are hereby incorporated by reference.

It should be understood that various modifications and variations of the present invention may be employed in practicing the invention. It is therefore to be understood that, within the scope of the appended claims, the invention may be practiced otherwise than as specifically described herein.

What is claimed is:

1. A method of forming a gate stack, the method comprising:
   providing a substrate in a process chamber;
   depositing a gate dielectric layer on the substrate, the gate dielectric layer comprising a metal element;
   selectively etching the metal element from at least a portion of the gate dielectric layer to form an etched gate dielectric layer with a reduced metal content, the portion of the gate dielectric layer at least including the entire top surface of the gate dielectric layer; and
   forming a gate electrode layer on the etched gate dielectric layer.

2. The method according to claim 1, wherein the gate dielectric layer comprises a metal oxide, a metal oxynitride, a metal silicate, or a nitrated metal silicate, or a combination of two or more thereof.

3. The method according to claim 1, wherein the gate dielectric layer comprises $Ta_2O_5$, $TaSiO_x$, $TaSiO_xN_y$, $TiO_2$, $ZrO_2$, $Al_2O_3$, $Y_2O_3$, $HfO_2$, $HfSiO_x$, $HfSiO_xN_y$, $HfO_xN_y$, $HfAlO_x$, $HfTaO_x$, $HfTiO_x$, $ZrO_2$, $ZrSiOx$, $ZrSiO_xN_y$, $ZrO_xN_y$, $SrO_x$, $SrSiO_x$, $SrSiO_xN_y$, $LaO_x$, $LaSiO_x$, $LaSiO_xN_y$, $LaAlO_x$, $La_2Hf_2O_3$, $LaScO_3$, $DyScO_3$, $PrO_2$, $Pr_2O_3$, $CeO_2$, $NdO_2$, $YO_x$, $YSiO_x$, or $YSiO_xN_y$, or a combination of two or more thereof.

4. The method according to claim 1, wherein the selectively etching comprises exposing the gate dielectric layer to a thermal etching gas.

5. The method according to claim 1, wherein the etching gas comprises HX, $X_2$, $C_xH_y$, or $C_xH_yX_z$, or a combination of two or more thereof.

6. The method according to claim 5, wherein the etching gas comprises HF, HCl, HBr, or HI, or a combination of two or more thereof.

7. The method according to claim 5, wherein the etching gas comprises $F_2$, $Cl_2$, $Br_2$, or $I_2$, or a combination of two or more thereof.

8. The method according to claim 5, wherein the $C_xH_y$ gas comprises $C_5F_8$, $C_4F_6$, $C_4F_8$, or $CF_4$, or a combination or mixture thereof, and the $C_xH_yX_z$ gas comprises $CHF_3$, $CH_2F_2$, $CHCl_3$, or $CH_2Cl_2$, or a combination of two or more thereof.

9. The method according to claim 1, wherein the selectively etching substantially depletes the metal element in the at least a portion of the gate dielectric layer.

10. The method according to claim 1, wherein the selectively etching forms a graded metal depth profile in the at least a portion of the gate dielectric layer.

11. The method according to claim 1, wherein the selectively etching reduces a thickness of the gate dielectric layer.

12. The method according to claim 1, wherein the selectively etching reduces the surface roughness of the surface of the gate dielectric layer exposed to the etching gas.

13. The method according to claim 1, wherein the gate dielectric layer comprises a metal silicate layer or a nitrated metal silicate layer and the etched gate dielectric layer comprises a $SiO_x$ layer substantially depleted of the metal element.

14. The method according to claim 13, wherein the $SiO_x$ layer is a complete layer.

15. The method according to claim 1, wherein the gate dielectric layer comprises a metal silicate layer or a nitrated metal silicate layer and the etched gate dielectric layer comprises a non-etched portion and an etched portion comprising a $SiO_x$ layer substantially depleted of the metal element.

16. The method according to claim 1, wherein the gate dielectric layer comprises a metal oxide layer or a nitrated metal oxide layer and the etched dielectric layer comprises a non-etched portion and an etched portion with reduced metal content.

17. The method according to claim 1, wherein the gate electrode layer comprises at least one of poly-Si, W, WN, Al, Ta, TaN, TaSiN, Mo, MoN, Zr, V, HfN, HfSiN, Ti, TiN, TiSiN, Re, Ru, Co, Pd, Ni, Ir, Pt, $In_2O_3$, $Os_2O_3$, $RuO_2$, $IrO_2$, ZnO, $MoO_2$, $ReO_2$, and SiGe.

18. The method according to claim 1, wherein the selectively etching a metal element from at least a portion of the gate dielectric layer comprises forming an etched gate dielectric layer comprising a $SiO_x$ layer substantially depleted of the metal element.

19. The method according to claim 18, wherein the etched gate dielectric layer further comprises a non-etched metal silicate portion or a non-etched nitrated metal silicate portion.

20. A method of forming a gate stack, the method comprising:
   providing a substrate in a process chamber;
   depositing a $HfSiO_x$ or $HfSiO_xN_y$ gate dielectric layer on the substrate;
   selectively etching the Hf element from at least a portion of the gate dielectric layer to form an etched gate dielectric layer, the portion of the gate dielectric layer at least including the entire top surface of the gate dielectric layer, wherein the selectively etching comprises exposing the gate dielectric layer to HCl etching gas; and
   forming a gate electrode layer on the etched gate dielectric layer.

21. The method according to claim 20, wherein the etched gate dielectric layer comprises a non-etched portion and an etched portion comprising a $SiO_x$ layer substantially depleted of Hf.

22. The method according to claim 20, wherein the etched gate dielectric layer comprises a $SiO_x$ layer thinner than the deposited $HfSiO_x$ or $HfSiO_xN_y$ gate dielectric layer and is substantially depleted of Hf.

23. The method according to claim 22, wherein the $SiO_x$ layer is a complete layer.

* * * * *